(12) United States Patent
Mei (10) Patent No.: US 6,495,411 B1
(45) Date of Patent: Dec. 17, 2002

(54) TECHNIQUE TO IMPROVE DEEP TRENCH CAPACITANCE BY INCREASING SURFACE THEREOF

(75) Inventor: Len Mei, Hsinchu (TW)

(73) Assignees: ProMos Technology Inc., Hsinchu (TW); Mosel Vitelic Inc., Hsinchu (TW); Siemens AG, Munich (DE)

( * ) Notice: Subject to any disclaimer, the term of this patent is extended or adjusted under 35 U.S.C. 154(b) by 0 days.

(21) Appl. No.: 09/686,842

(22) Filed: Oct. 10, 2000

Related U.S. Application Data (60) Provisional application No. 60/217,913, filed on Jul. 13, 2000.

(51) Int. Cl.[7] ................ H01L 21/8242; H01L 27/108
(52) U.S. Cl. .................. 438/239; 438/243; 438/700; 438/701; 438/386; 438/238; 438/255; 438/398; 438/665; 438/964; 257/301; 257/309
(58) Field of Search ................ 438/239, 243, 438/248, 386, 700, 701, 705, 238, 255, 398, 665, 964; 257/301, 309

(56) References Cited

U.S. PATENT DOCUMENTS

| | | | | | |
|---|---|---|---|---|---|
| 5,811,333 A | * | 9/1998 | Zenke | ............ | 438/255 |
| 5,937,292 A | * | 8/1999 | Hammerl et al. | ............ | 438/243 |
| 6,232,171 B1 | * | 5/2001 | Mei | ............ | 438/246 |
| 6,291,353 B1 | * | 9/2001 | Muller et al. | ............ | 438/700 |
| 6,319,787 B1 | * | 11/2001 | Enders et al. | ............ | 438/386 |
| 6,362,040 B1 | * | 3/2002 | Tews et al. | ............ | 438/246 |
| 6,417,063 B1 | * | 7/2002 | Petter et al. | ............ | 438/386 |

* cited by examiner

*Primary Examiner*—Matthew Smith
*Assistant Examiner*—Belur V Keshavan
(74) *Attorney, Agent, or Firm*—W. Wayne Liauh (57) ABSTRACT

A method for fabricating deep-submicron DRAMs containing a deep trench capacitor with enlarged sidewall surface for improved storage capacitance. It includes the main steps of: (a) forming a silicon substrate having a (110) crystalline plane and a (111) crystalline plane; (b) forming a vertically extending deep trench into a crystalline silicon substrate; (c) filling the deep trench with a first dielectric material to form a first dielectric filler layer; (d) etching back the first dielectric filler layer to a first depth; (e) forming a dielectric collar from a second dielectric material which hangs on the sidewall of the deep trench extending from the opening of the trench to the first depth; (f) removing the first dielectric filler layer with a selective etching process; and (g) under a carefully timed exposure, using an isotropic etching solution which has high etching rate in the (110) plane and low etching rate in the (111) plane to form a roughened surface on the bottom surface of the deep trench. A roughened surface has a root-mean-square (RMS) surface roughness of at least 100 Å can be obtained. Since this method does not require enlargement in either the vertical direction or the horizontal direction (as in the case of bottle-shaped deep trenches), it is most advantageous for use in advanced DRAM manufacturing processes, especially those process with feature sizes of 0.15 $\mu$m and below.

20 Claims, 8 Drawing Sheets

TECHNIQUE TO IMPROVE DEEP TRENCH CAPACITANCE BY INCREASING SURFACE THEREOF

This application claims the benefit of Provisional Application No. 60/217,913, field Jul. 13, 2000.

FIELD OF THE INVENTION

The present invention relates to a method for improving the capacitance of a deep trench capacitor formed into a silicon substrate as part of a semiconductor device by increasing the surface area inside the deep trench. More specifically, the present invention relates to a novel method for improving the capacitance of a vertically elongated trench, or deep trench, that is formed into a crystalline silicon substrate as part of a semiconductor device, such as a dynamic random access memory (DRAM) cell, by increasing its effective sidewall surface area. Unlike the bottle-shaped deep trenches, the method of the present invention does not need to enlarge the diameter of the bottom portion of the deep trench. Thus, the present invention can very effectively increase the capacitance of a deep trench without incurring substantially increased manufacturing cost. But more importantly, the method of the present invention can be used in conjunction with DRAM technologies down to 0.15 µm or below, where it becomes very difficult to further enlarge the diameter and form a bottle-shaped deep trench.

BACKGROUND OF THE INVENTION

In order to reduce production cost and increase performance, semiconductor manufacturers are facing constant pressures to reduce the physical dimensions of semiconductor devices while containing the manufacturing cost. For dynamic random access memory (DRAM) cells, their nominal physical dimensions have now shrunk to 0.15 µm or below (and the technology associated with making the 0.15 µm cells is called the 0.15 µm technology, etc.). This presents great challenges in many technical areas.

The task to provide high capacitance capacitors for the deep sub-micron features presents one of the most challenges. The capacitance of a capacitor is proportional to the total surface area between the two electrodes of the capacitor. As the physical dimension of the semiconductor devices is reduced, the surface area of a deep trench is also reduced. Indeed, due to its reduced physical dimension, and thus reduced storage capacitance, the deep trench has become a key limiting factor for further reducing the size of semiconductors. One way to increase the surface area of a deep trench, of course, is to make it deeper. However, currently, the depth-to-diameter aspect ratio of the deep trench is already running more than 40 to 1. The size of the deep trench opening shrinks proportionally to the feature size of technology. As the technology moves from 0.17 µm to 0.15 µm or lower, it presents a major challenge to the etching technology to further increase the aspect ratio.

In order to further increase the surface area, and thus the storage capacitance, of a deep trench, the so-called bottle-shaped deep trenches have been developed. U.S. Pat. No. 5,658,816 (hereinafter the '816 patent) discloses a method which involves the steps of (1) forming the top portion of the deep trench; (2) forming a nitride sidewall spacer in the top portion of the deep trench; (3) forming the bottom portion of the deep trench; (4) oxidizing the bottom portion of the deep trench; and (5) etching the oxidized bottom portion of the deep trench to enlarge the diameter thereof.

Because the method disclosed in the '816 patent is high impractical, other techniques have been developed to form bottle-shaped deep trenches. For example, in an article entitled "0.228 µm Trench Cell Technologies with Bottle-Shaped Capacitor for 1 Gbit DRAMs", by T. Ozaki, et al, *IEDM*, 95, PP661–664 (1995), the authors disclosed a method to increase the diameter of a deep trench. The method disclosed therein includes the steps of: (1) forming an 80 nm collar oxide at the upper portion of the trench by the selective oxidation; (2) performing a capacitor process which includes oxidation mask removal, native oxide removal, etc., during which process the collar oxide thickness reduces to 50 nm; and (3) in-situ phosphorous doped polysilicon is deposited and phosphorous doping into the trench side wall at the capacitor portion (plate electrode) is performed by the furnace annealing technology. The collar oxide prevents phosphorous doping at the upper portion of the trench; it also makes the electrical isolation between the plate electrode and the transfer transistor. The poly-silicon is removed by chemical dry etching and the diameter of the trench under the collar oxide is enlarged at the same time. The authors reported that the trench diameter is enlarged by 30%, thus forming a "bottled-shaped" deep trench.

U.S. Pat. No. 5,849,638 (hereinafter the '638 patent) discloses a method to further enhance the sidewall surface area of a deep trench. The method disclosed in the '638 patent, the content thereof in incorporated herein by reference, includes the steps of: (1) opening a deep trench mask at an angle for the first trench; (2) etching a trench using RIBE (reactive ion beam etching) with the wafer oriented 1 to 16 degrees off axis with respect to the ion source; (3) opening the deep trench mask at an angle for the second trench; (4) etching the trench using RIBE with the wafer oriented 1 to 15 degrees in the opposite direction; (5) oxide collar formation; and (6) chemical down-stream etching (CDE) to isotropically increase the size of the trench. Steps (5) to (6) were taken from and are identical to the procedure disclosed by Ozaki et al, which included the steps of forming an oxide collar and etching the entire trench sidewall not covered by the oxide collar. As with the Ozaki et al technique, the method taught in the '638 patent may not provide enough precision in deep sub-micron applications.

In a co-pending application, Ser. No. 09/327,872, which is invented by the same inventor of the present invention and the content thereof is incorporated herein by reference, it is disclosed a further improved method for forming bottle-shaped trenches which comprises the steps of: (a) forming a deep trench into an active region of a substrate, the deep trench having a sidewall defining the trench inside the substrate; (b) forming a oxide filler layer which fills the deep trench; (c) etching the oxide filler layer to a predetermined depth, to reveal an upper portion of the sidewall above the predetermined depth; (d) forming a nitride sidewall spacer cover the upper portion of the sidewall; (e) etching away the oxide filler layer to reveal the lower portion of the sidewall; (f) using the sidewall spacer as a mask to either selectively etch away the lower portion of the sidewall or cause the lower portion of the sidewall to be subject to a chemical reaction so that the lower portion of the sidewall can be etched away and thus causing the trench width in the lower portion to be enlarged; and (g) removing the chemically altered lower portion of the sidewall if it is not already removed, to form a bottle-shaped deep trench having an enhanced sidewall surface at the lower portion.

The process disclosed in the '872 application substantially improves the precision and simplifies the process of forming bottle-shaped deep trenches. However, since the storage surface of the deep trench capacitor is only linearly proportional to the diameter of the deep trench, the bottom portion of the deep trench must be substantially enlarged to achieve the intended improvement. Such enlargement becomes very difficult for deep sub-micron DRAM technologies of 0.15 µm and below. Thus, a radically different approach other than the bottle-shaped configuration must be developed in an attempt to increase the capacitance of deep trench capacitors.

U.S. Pat. No. 6,025,225 (hereinafter the '225 patent) discloses a method wherein an amorphous silicon layer is formed on the sidewall and bottom surface of a deep trench, the amorphous silicon layer is then roughened using an etching solution which contains phosphoric acid ($H_3PO_4$) to increase the surface of the trench capacitor. This method is impractical in that it attempts to increase the surface area by first reducing the diameter (and thus reducing the surface area) of the deep trench. But more importantly, the '225 patent assumes a straight (i.e., constant cross-sectional area) of the deep trench. As discussed above, for 0.15 µm processes or below, the diameter of the deep trench can decrease substantially in the bottom portion. The '225 patent, which involves the deposition of an amorphous silicon layer onto the sidewall of the deep trench, can cause the bottom portion of the deep trench to be plugged when it is applied to the 0.15 µm processes or below.

SUMMARY OF THE INVENTION

The primary object of the present invention is to develop a method for improving the total internal surface area of a deep trench which has been formed in a silicon substrate. More specifically, the primary object of the present invention is to develop a method for improving the total effective (internal) surface area, and thus the storage capacitance, of a deep trench capacitor which has been formed in a crystalline silicon substrate in a semiconductor device, such as a dynamic random access memory (DRAM) cell, so as to allow the physical dimension of the DRAM cells to be further reduced without sacrificing performance.

One of the key elements of the method of the present invention is that, unlike the so-called bottle-shaped deep trenches, the present invention does not involve the complicated steps to enlarge the trench diameter. Rather, the present invention utilizes an anisotropic etching solution—anisotropic with respect to different crystal planes of the silicon substrate, e.g., high etchability in the (110) plane but low etchability in the (111) plane—in conjunction with a carefully timed exposure, to form a roughened surface inside the deep trench. The roughened surface allows the overall charge storage surface of the deep trench capacitor to be increased by more than two-fold, without having to enlarge the diameter of the deep trench.

The novel process of the present invention for fabricating a deep trench with enlarged surface without enlarging its diameter comprises the following main steps:

(1) Forming a deep trench into a crystalline silicon substrate;

(2) Filling the deep trench with a first dielectric material to form a first dielectric filler layer;

(3) Etching the first dielectric filler layer to a first depth;

(4) Forming a dielectric collar from a second dielectric material which hangs on the sidewall of the deep trench extending from the opening of the trench to the first depth;

(5) Removing the first dielectric filler layer with a selective etching process;

(6) Under a carefully timed exposure, using an anisotropic etching process which has different etching rates in different crystalline planes of the silicon substrate, to form a roughened surface on the bottom surface of the deep trench; and (7) Continuing with other conventional steps.

In the preferred embodiment of the present invention, when the silicon substrate is formed, it exhibits a distinctive (110) crystal plan and a (111) crystal plan. As it is well known in the art, crystalline planes are identified by a series of three numbers known as Miller Indices, each set of Miller indices identifies the location of a specific plane in the crystal. Preferably, the silicon substrate for the present invention is formed such that the (110) crystal plane is substantially parallel to the wafer base surface (or substantially vertical to the sidewall). The first dielectric material is preferably an oxide, and the second dielectric material is preferably a nitride. Preferably, the ratio between the etching rates in the (110) and the (111) planes during the anisotropic etching process is at least 20, preferably at least 40.

The nitride collar can remain in the deep trench during the subsequent ion implantation step and the step of depositing a conductive material to form the respective electrode plates, and remain as a part of the resulting deep trench capacitor. However, the key step of the present invention is to using the horizontally-preferential anisotropic etching process to form a roughened surface inside the deep trench. If alternative appropriate steps can be implemented, the steps of forming the nitride collar can be omitted.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

The present invention discloses a novel method for increasing the total internal surface area of a deep trench without the need to enlarge the diameter of the deep trench. The method of the present invention is most advantageous for fabricating deep trench capacitors in a crystalline silicon substrate as a component of a semiconductor device, such as a dynamic random access memory (DRAM) cell, using the 0.15 μm technology of below. At such small feature size, it becomes very difficult to further increase the depth, or, as in the case of the so-called bottle-shaped deep trenches, the diameter of the deep trench.

As discussed above, one of the key elements of the method of the present invention is that, unlike the bottle-shaped deep trenches, the present invention does not need to enlarge the trench diameter to increase the sidewall surface area. Rather, the present invention utilizes an anisotropic etching process—anisotropic with respect to the etching rates in different crystal planes of the silicon substrate, e.g., relatively high etchability in the (110) crystalline plan, but relatively low etchability in the (111) crystalline plan—in conjunction with a carefully timed exposure, to form a roughened surface inside the deep trench. The roughened surface allows the overall charge storage surface of the deep trench capacitor to be increased by more than two-folds, without having to enlarge the diameter of the deep trench.

The novel process of the present invention for fabricating a deep trench with enlarged surface without enlarging its diameter comprises the following main steps:

(a) forming a crystalline silicon substrate having two distinctive crystalline planes;

(b) forming a vertically extending deep trench into a crystalline silicon substrate;

(c) filling the deep trench with a first dielectric material to form a first dielectric filler layer;

(d) etching back the first dielectric filler layer to a first depth;

(e) forming a dielectric collar from a second dielectric material which hangs on the sidewall of the deep trench extending from the opening of the trench to the first depth;

(f) removing the first dielectric filler layer with a selective etching process; and (g) under a carefully timed exposure, using an anisotropic etching solution which has different etching rates in the two crystalline planes to form a roughened surface on a bottom portion of a sidewall of the deep trench.

The above process is then continued with other conventional steps to complete the fabrication of the deep trench capacitor.

Preferably, the silicon substrate is formed to have a distinctive (110) crystal plan which is substantial parallel to the wafer base surface. This can be done in the conventional processes and will not be elaborated in this disclosure. The first dielectric material is preferably an oxide, and the second dielectric material is preferably a nitride. Preferably, the ration between the etching rates in the (110) and (111) planes during the anisotropic etching process is at least 20, preferably at least 40.

In subsequent steps to form the deep trench capacitor, the nitride collar can remain in the deep trench during the subsequent ion implantation step to form the first conductive electrode plate, and the step of depositing a conductive material to form the second conductive electrode plate, and become a part of the resulting deep trench capacitor. However, the key step of the present invention is to using the horizontally-preferential anisotropic etching process to form the roughened surface inside the deep trench. If alternative appropriate steps can be implemented, the steps of forming the nitride collar can be omitted.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

FIGS. 1 through 9 show, schematically, the main steps of forming a deep trench with enlarged sidewall surface according to a preferred embodiment of the present invention. These drawings are discussed in more detail below.

Figure 1:
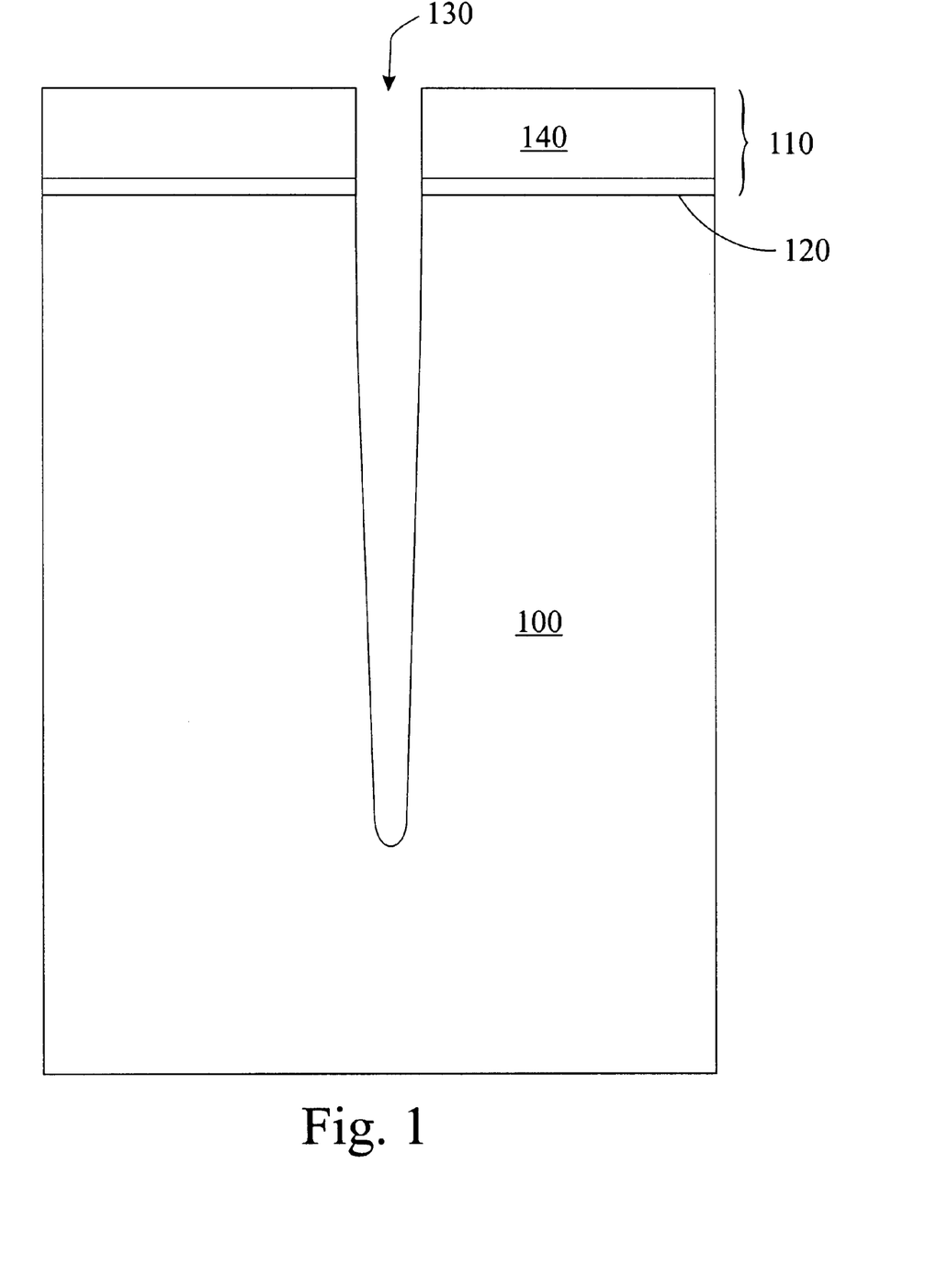
FIG. 1 is an illustrative diagram showing a vertical cross-section of a conventional deep trench having a trench diameter of 0.2 µm and 0.1 µm at its opening and end, respectively, and a length of 7.5 µm.

FIG. 1 shows that a deep trench 130 is formed, using an anisotropic dry etching procedure, into a crystalline silicon substrate 100. The silicon substrate is formed so that is has a distinctive (110) crystalline plane and a (111) crystalline plane.

FIG. 1 also shows, on the top of the substrate 100, a very thin pad oxide layer 120 having a thickness of about 50 Å and a relatively thick nitride layer 140 having a thickness of about 2,000 Å. Collectively, the pad oxide layer 120 and the nitride layer 140 constitute a pad layer 110. In Example 1, the trench has a trench opening of 0.2 μm and a length of 7.5 μm. The trench width tapers from 0.2 μm at the top to about 0.1 μm at the bottom, due to the limitations of the currently available anisotropic technology when applied to the small trench opening and the large length-to-width ratio encountered in fabrication deep sub-micron semiconductor devices. The oxide layer can be a silicon oxide layer, formed by thermal oxide growth. The nitride layer can be a SiN layer, formed by low pressure chemical vapor deposition (LPCVD) using $SiH_2Cl_2$ and $NH_3$ as reactants. The nitride layer can be used as an etch mask in subsequent oxide etching processes. The trench can be formed using an anisotropic dry etching process, such as using a carbon fluoride gas such as $CHF_3$ as the main etching component in a reactive ion etch (RIE) process.

Figure 2:
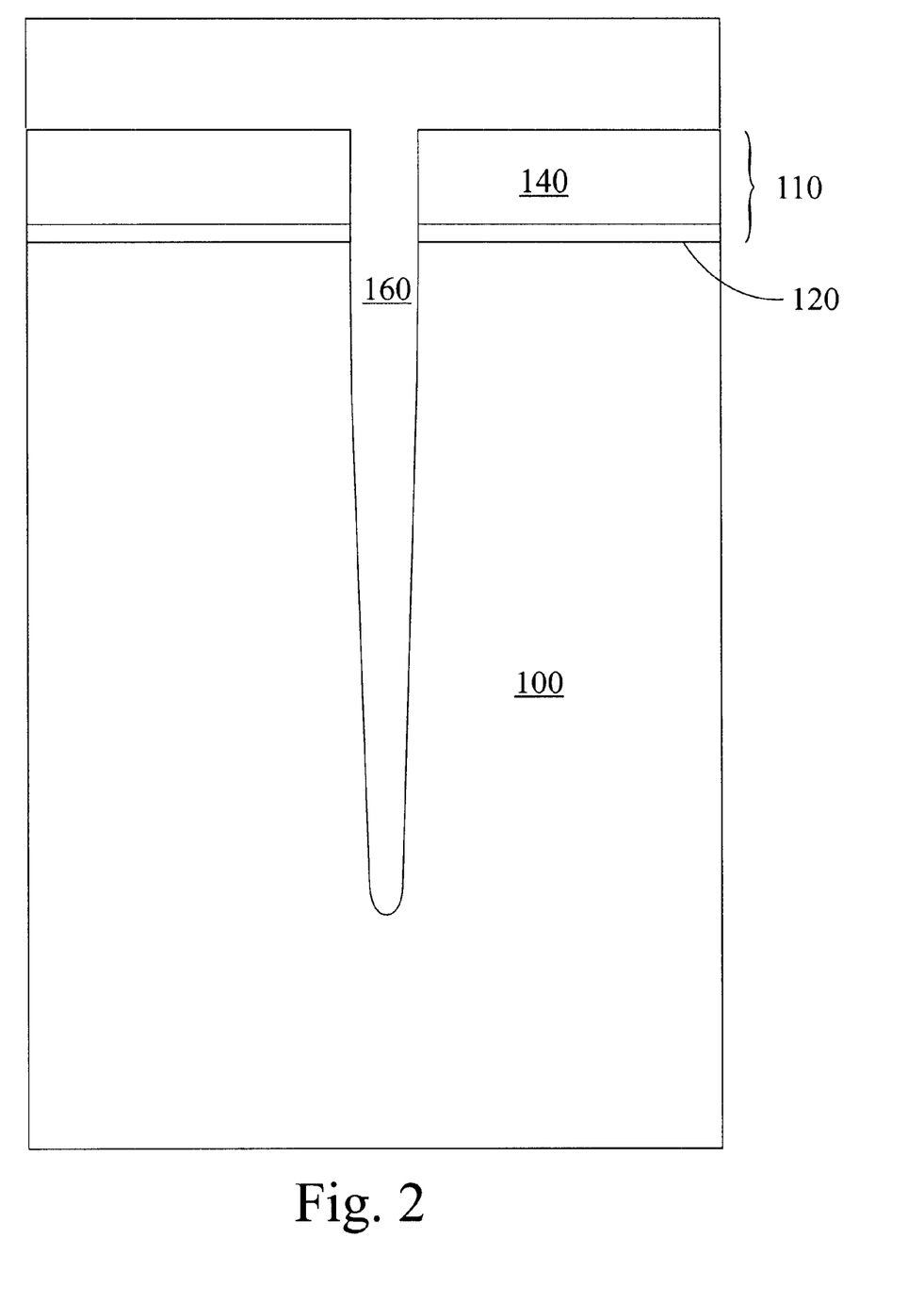
FIG. 2 is an illustrative diagram showing the first step of the process according to a preferred embodiment of the present invention in which a filler oxide is deposited to form an oxide filler layer which fills the trench.
Figure 3:
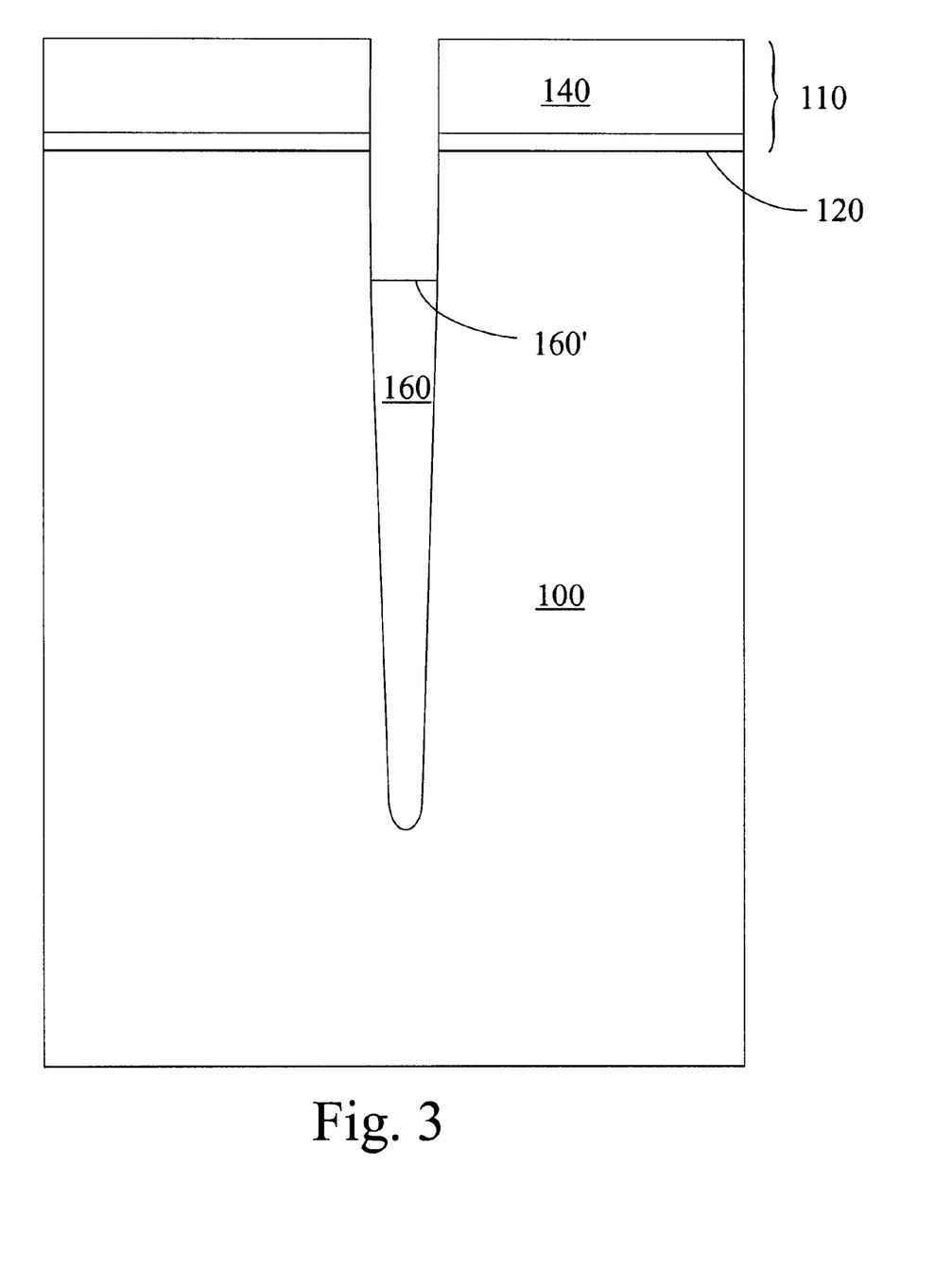
FIG. 3 is an illustrative diagram showing that the filler oxide layer which filled the trench is etched back to a first depth.

FIG. 2 shows that a filler oxide layer 160 of approximately 2,000 Å is deposited on the wafer surface. The purpose of the filler oxide layer to fill the trench and form the filler oxide layer 160. The filler oxide layer is etched back to a predetermined depth 160', as shown in FIG. 3, using a wet oxide etch or dry etching step. This depth marks the threshold of the bottle-shaped trench to be fabricated in the present invention. In this step, the filler oxide should be selected so that it exhibits a high etchability relative to a nitride sidewall spacer that will be subsequently formed, using a selective etcher. The filler oxide layer can be a silicon oxide layer, formed using a high density plasma chemical vapor deposition (HDPCVD) process. The filler silicon oxide layer can be etched backed using buffered hydrofluoric acid in a wet etch process. Hydrofluoric acid reacts very quick with silicon oxide, while leaving the silicon-based substrate unaffected.

Figure 4:
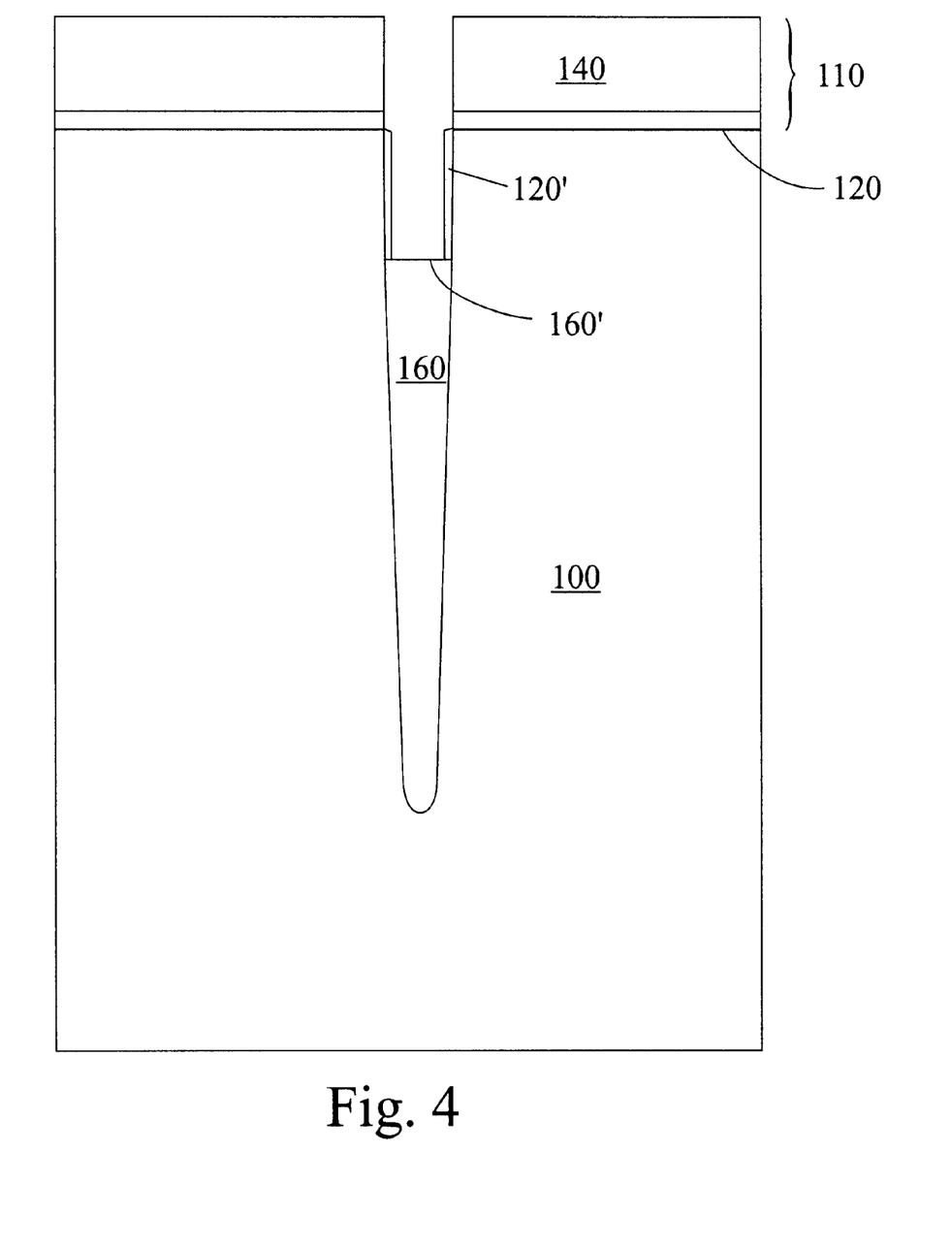
FIG. 4 is an illustrative diagram showing that a pad oxide layer is formed on the sidewall of the deep trench.

FIG. 4 a thin vertical pad oxide layer 120' of about 50 Å is formed on the sidewall of the deep trench down to the predetermined depth 160' (i.e., above the oxide filler layer 160), by (thermal) pad oxidation.

Figure 5:
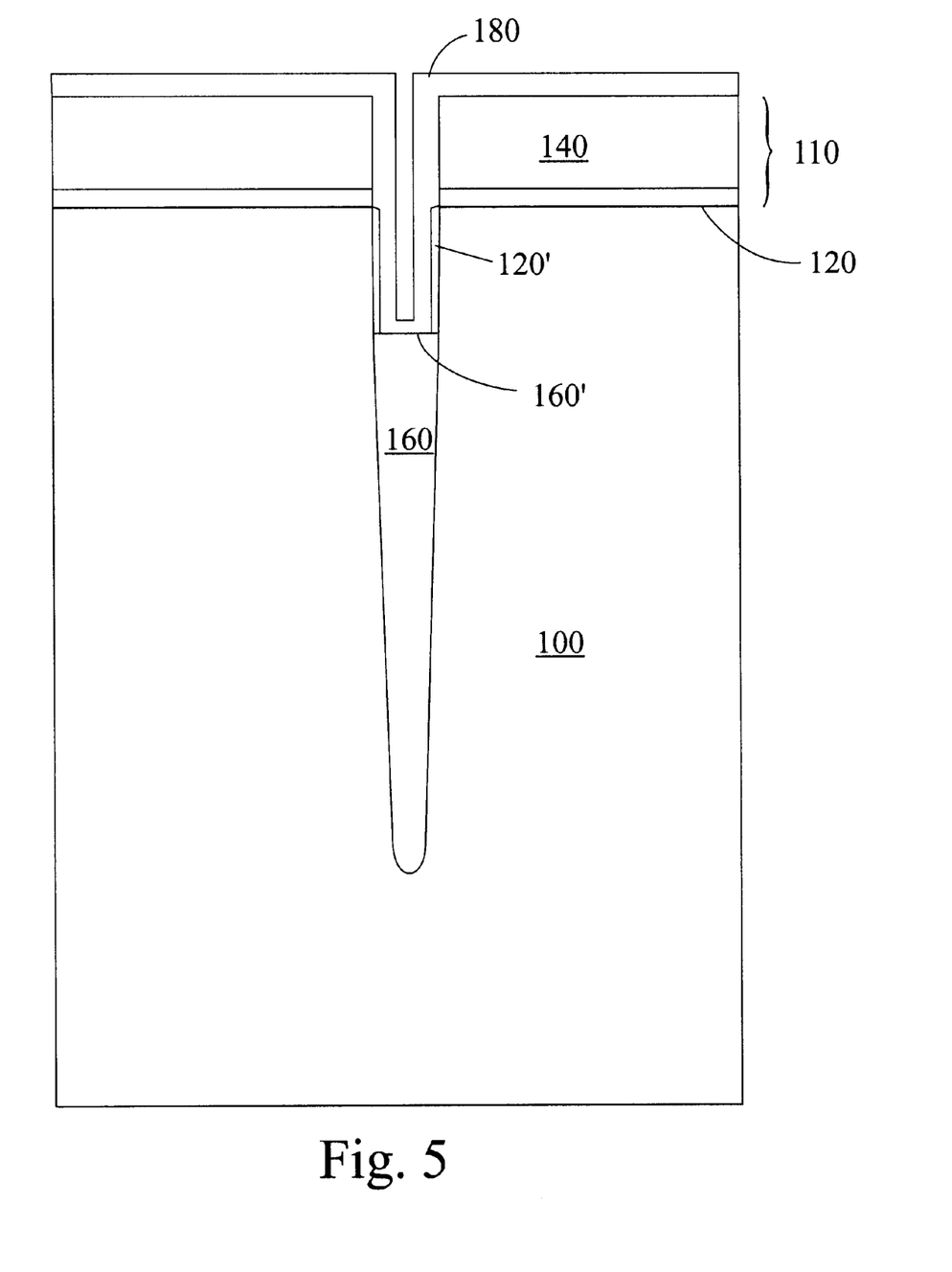
FIG. 5 is an illustrative diagram showing that a thin nitride layer conforming to the contour of the sidewall of the deep trench is formed on the surface of the pad oxide layer at depths above the filler oxide layer.

Subsequently, a thin nitride layer 180 of about 200 Å thick conforming to the contour of the sidewall of the deep trench is formed on the surface of the pad oxide layer and on top of the filler oxide layer, as shown in FIG. 5. The pad oxide layer can be formed by thermal oxide growth. The nitride layer can be can be a SiN layer, formed by low pressure chemical vapor deposition (LPCVD) using $SiH_2Cl_2$ and $NH_3$ as reactants.

Figure 6:
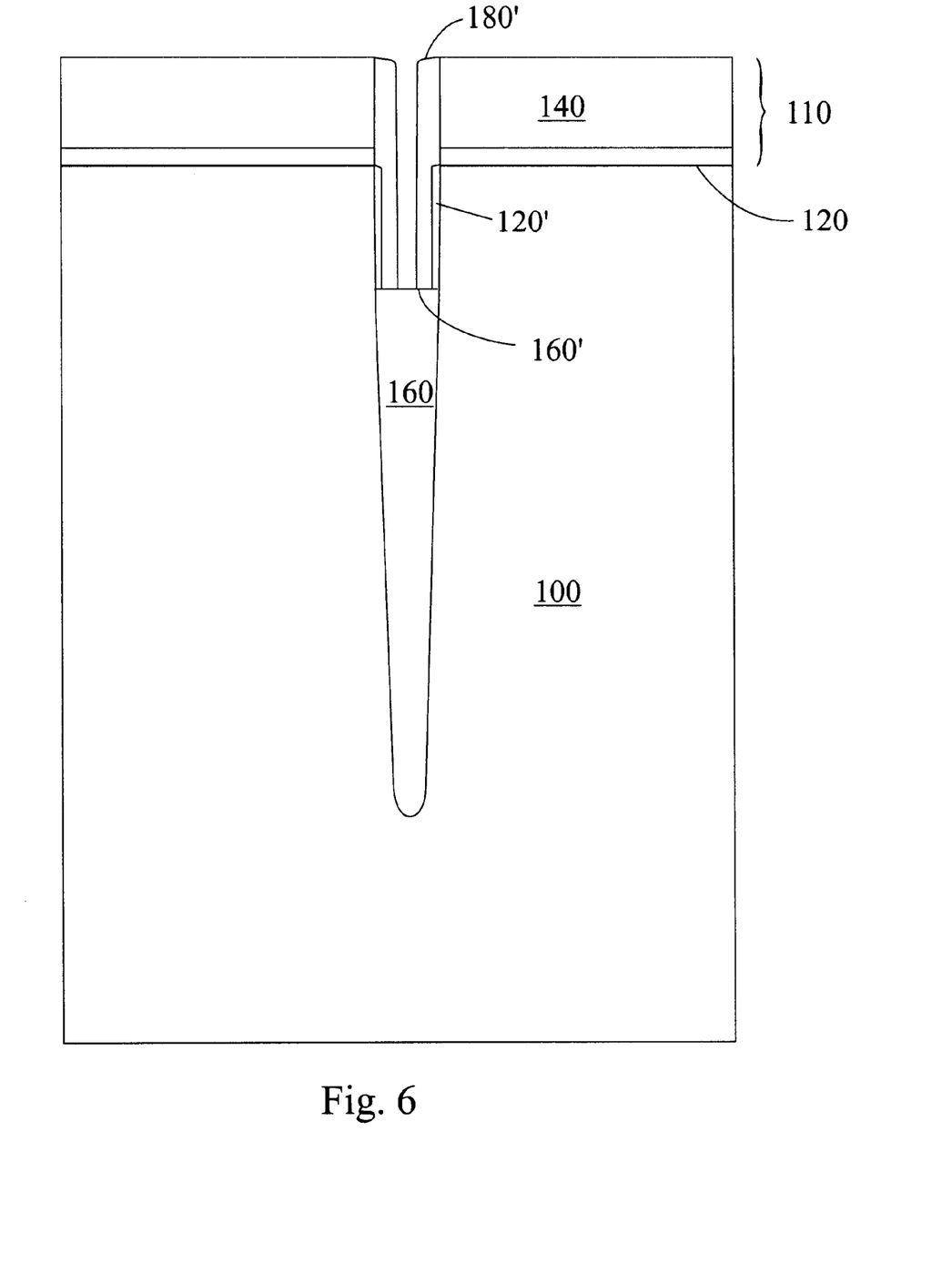
FIG. 6 is an illustrative diagram showing that a nitride collar is formed from the nitride layer by anisotropic etching.
Figure 7:
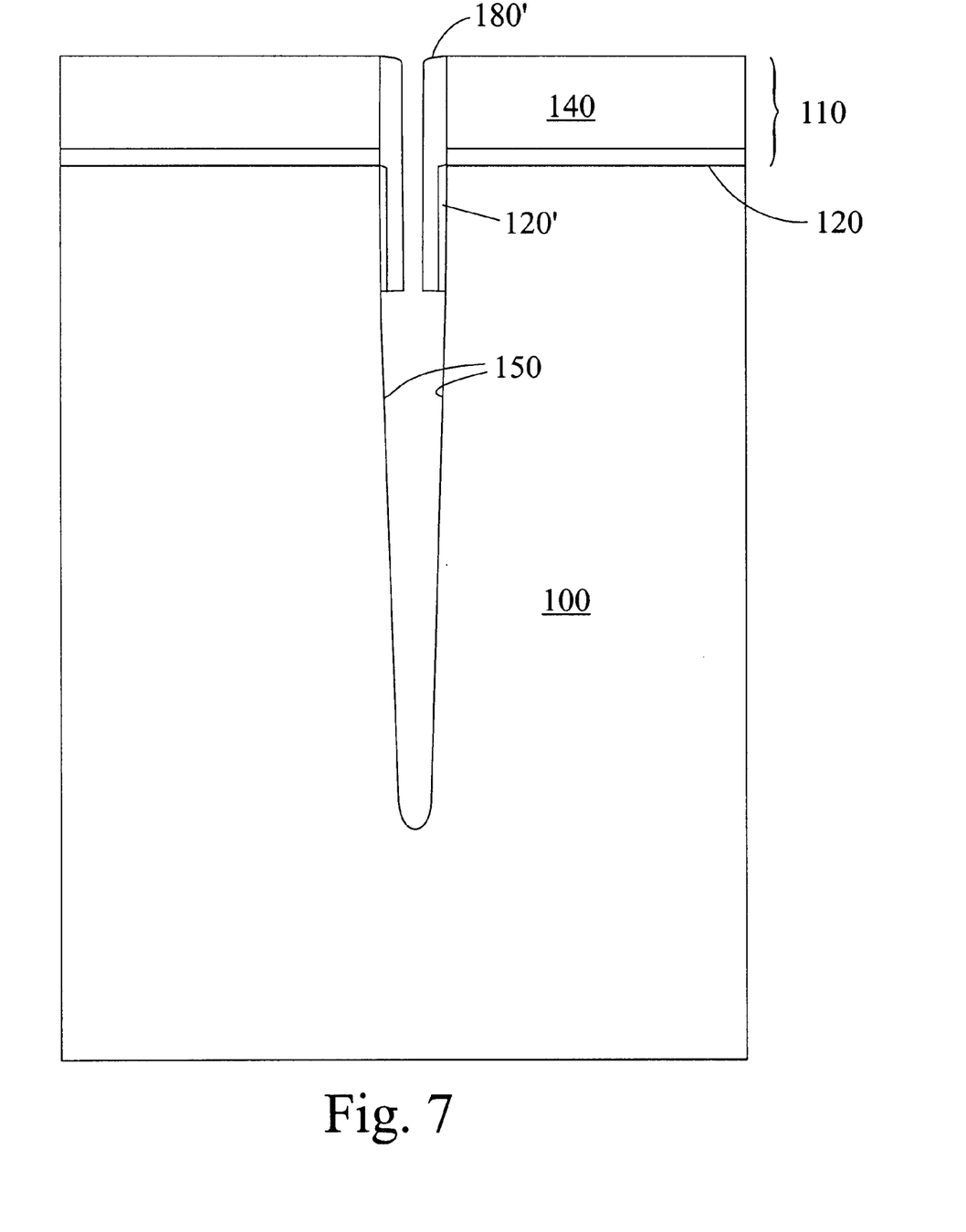
FIG. 7 is an illustrative diagram showing that the filler oxide layer is etched away using a selective etching process leaving the nitride collar inside the trench.

FIG. 6 shows that a nitride collar 180' is formed from the nitride layer 180 by anisotropic etching, typically using a dry etch process. Thereafter, a wet oxide dip process using HF is performed to remove the remaining oxide filler layer 160. This is shown in FIG. 7. The HF wet oxide dip process is highly selective and the nitride collar protects other area on the substrate.

Figure 8:
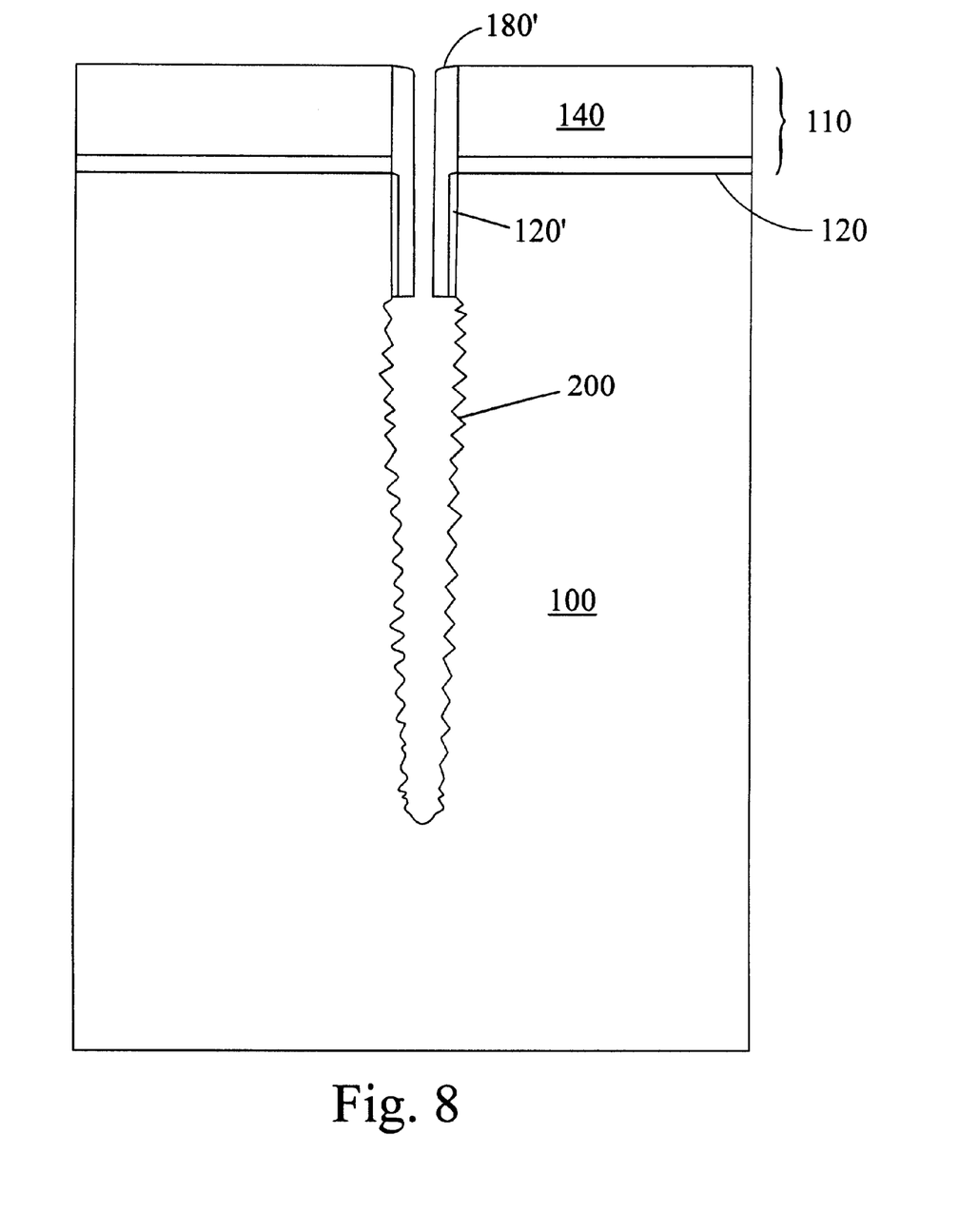
FIG. 8 is an illustrative diagram showing that, by using a horizontally-preferential anisotropic etching process in conjunction with a carefully timed exposure, the sidewall of the lower portion of the deep trench below the nitride collar is roughened to provide a substantially enhanced surface area without enlarging the deep trench diameter.

Finally, FIG. 8 shows that, by performing an anisotropic Si etching process in an aqueous alkaline of 2% KOH solution at 70° C., the sidewall of the lower portion of the deep trench below the nitride collar is roughened to provide a roughened surface 200 with a substantially enhanced surface area. The etch rates are approximately 500 Å/min for the (110) plane, and 11 Å/min for the (111) crystal plane. The etching time is controlled at about 1 minute, and a surface roughness of 200 Å RMS (root-mean-square) is generated. This roughness increases the effective surface by more than two-folds.

In summary, by using the novel process disclosed in the present invention, the charge storage area of the deep trench capacitor can be increased by at least 100%. Because the present invention does not require extensions of the deep trench in either the vertical or horizontal direction, it is most advantageous for use in advanced DRAM manufacturing processes, especially for feature sizes of 0.15 μm or below.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for fabricating a semiconductor device containing a deep trench capacitor, said process comprising the following steps:
   (a) forming a silicon substrate having a first crystalline plane and a second crystalline plane;
   (b) forming a deep trench into said silicon substrate, said deep trench having a sidewall which defines said trench inside said substrate;
   (c) forming a first dielectric filler layer using a first dielectric material to fill said deep trench;
   (d) etching said first dielectric filler layer down to a first depth, to reveal an upper portion of said sidewall above said first depth;
   (e) forming a dielectric collar using a second dielectric material which exhibits a substantially slower etch rate than said first dielectric material;
   (f) removing said first dielectric material while leaving said dielectric collar in place by selective etching, to reveal a lower portion of said sidewall; and
   (g) using an anisotropic etching process, which has a higher etching rate in said first crystalline plane than in said second crystalline plane, to form a roughened surface on said lower portion of said sidewall.

2. The method for fabricating a semiconductor device containing a deep trench according to claim 1 wherein said first crystalline plane is a (110) plane and said second crystalline plane is a (111) plane.

3. The method for fabricating a semiconductor device containing a deep trench according to claim 1 wherein said first crystalline plane is generally parallel to a horizontal direction of said substrate.

4. The method for fabricating a semiconductor device containing a deep trench according to claim 1 wherein said anisotropic etching process has an etching rate in said first crystalline plane that is at least 20 times of that in said second crystalline plane.

5. The method for fabricating a semiconductor device containing a deep trench according to claim 1 wherein said anisotropic etching process has an etching rate in said first crystalline plane that is at least 40 times of that in said second crystalline plane.

6. The method for fabricating a semiconductor device containing a deep trench according to claim 1 wherein said roughened surface has a root-mean-square (RMS) surface roughness of at least 100 Å.

7. The method for fabricating a semiconductor device containing a deep trench according to claim 1 wherein said roughened surface has a root-mean-square (RMS) surface roughness of at least 200 Å.

8. The method for fabricating a semiconductor device containing a deep trench according to claim 1 wherein said first dielectric material is an oxide so that said first dielectric filler layer becomes an oxide filler layer and said second dielectric material is a nitride.

9. The method for fabricating a semiconductor device containing a deep trench according to claim 8 wherein said dielectric collar is formed using a process which comprises the following steps:
   (a) using a chemical vapor deposition process to deposit a nitride layer on said upper portion of said sidewall surface and on top of said oxide filler layer; and
   (b) using an anisotropic etching procedure to form said dielectric collar from said nitride layer.

10. The method for fabricating a semiconductor device containing a deep trench according to claim 1 wherein anisotropic etching process is performed in a 2% aqueous KOH solution at about 70° C. for one minute.

11. A method for fabricating a semiconductor device containing a deep trench capacitor, wherein said deep trench is formed using a process comprising the following steps:
   (a) forming a silicon substrate having a first crystalline plane and a second crystalline plane;
   (b) forming a deep trench into said silicon substrate, said deep trench having a sidewall which defines said trench inside said substrate;
   (c) using an anisotropic etching process, which has a higher etching rate in said first crystalline plane than in said second crystalline plane, to form a roughened surface on a lower portion of said sidewall.

12. The method for fabricating a semiconductor device containing a deep trench according to claim 11 wherein anisotropic etching process is performed in a 2% aqueous KOH solution at about 70° C. for one minute.

13. The method for fabricating a semiconductor device containing a deep trench according to claim 11 wherein said first crystalline plane is generally parallel to a horizontal direction of said substrate.

14. The method for fabricating a semiconductor device containing a deep trench according to claim 11 wherein said first crystalline plane is a (110) plane and said second crystalline plane is a (111) plane.

15. The method for fabricating a semiconductor device containing a deep trench according to claim 14 wherein said anisotropic etching process has an etching rate in said first crystalline plane that is at least 20 times of that in said second crystalline plane.

16. The method for fabricating a semiconductor device containing a deep trench according to claim 14 wherein said anisotropic etching process has an etching rate in said first crystalline plane that is at least 40 times of that in said second crystalline plane.

17. The method for fabricating a semiconductor device containing a deep trench according to claim 11 wherein said roughened surface has a root-mean-square (RMS) surface roughness of at least 100 Å.

18. The method for fabricating a semiconductor device containing a deep trench according to claim 11 wherein said roughened surface has a root-mean-square (RMS) surface roughness of at least 200 Å.

19. A dynamic random access memory (DRAM) cell containing a deep trench capacitor wherein said deep trench capacitor contains roughened sidewall surface having a root-mean-square (RMS) surface roughness of at least 200 Å.

20. A dynamic random access memory (DRAM) cell containing a deep trench capacitor according to claim 19 wherein said deep trench capacitor further contains a nitride collar above said roughened sidewall surface.

* * * * *